US012692993B2

(12) United States Patent     (10) Patent No.:   US 12,692,993 B2
Kleijnen et al.     (45) Date of Patent:    Jul. 28, 2026

(54) FLEXIBLE LIGHTING DEVICE AND SUPPORT STRUCTURE

(71) Applicant: LUMILEDS LLC, San Jose, CA (US)

(72) Inventors: Christian Kleijnen, Ell (NL); Floris Maria Hermansz Crompvoets, Bunde (NL)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 55 days.

(21) Appl. No.: 18/007,718

(22) PCT Filed: Jun. 3, 2021

(86) PCT No.: PCT/US2021/035793
§ 371 (c)(1),
(2) Date: Dec. 1, 2022

(87) PCT Pub. No.: WO2021/247932
PCT Pub. Date: Dec. 9, 2021

(65) Prior Publication Data
US 2023/0332751 A1     Oct. 19, 2023

Related U.S. Application Data

(60) Provisional application No. 63/034,195, filed on Jun. 3, 2020.

(30) Foreign Application Priority Data

Jul. 30, 2020   (EP) .................................... 20188569

(51) Int. Cl.
*F21S 4/26*     (2016.01)
*F21K 9/232*     (2016.01)
(Continued)

(52) U.S. Cl.
CPC .................. *F21S 4/26* (2016.01); *F21V 9/30* (2018.02); *H10H 20/8512* (2025.01);
(Continued)

(58) Field of Classification Search
CPC ....... F21S 4/22; F21S 4/24; F21S 4/26; F21V 7/0008; F21Y 2107/70; F21K 9/61;
(Continued)

(56) References Cited

U.S. PATENT DOCUMENTS 6,354,714 B1   3/2002   Rhodes
2012/0002417 A1   1/2012   Li
(Continued)

FOREIGN PATENT DOCUMENTS

CN     102840472 A   *   12/2012
CN     204459901 U    7/2015
(Continued)

OTHER PUBLICATIONS

Machine translation of CN 102840472 A retrieved from the FIT database of PE2E search. (Year: 2023).*
(Continued)

*Primary Examiner* — Colin J Cattanach
(74) *Attorney, Agent, or Firm* — Volpe Koenig

(57) ABSTRACT

A flexible lighting device includes a flexible transparent body that extends along a length direction of the lighting device, the flexible transparent body comprising particles dispersed therein. The flexible light device also includes a flexible substrate, embedded in the flexible transparent body, and extending along a length direction of the lighting device. The flexible substrate separates the flexible transparent body into a first portion that has a first concentration of the particles and a second portion that has a second concentration of the particles. The first concentration may be different than the second concentration, and the first surface of the (Continued)

flexible substrate may face the first portion and a second surface of the flexible substrate may face the second portion. At least two light emitting elements may be arranged on the first surface of the flexible substrate along the length direction of the lighting device.

2 Claims, 5 Drawing Sheets

(51) Int. Cl.

| | |
|---|---|
| *F21K 9/61* | (2016.01) |
| *F21K 9/64* | (2016.01) |
| *F21K 9/66* | (2016.01) |
| *F21K 9/69* | (2016.01) |
| *F21S 4/22* | (2016.01) |
| *F21S 4/24* | (2016.01) |
| *F21V 7/00* | (2006.01) |
| *F21V 9/30* | (2018.01) |
| *F21Y 103/10* | (2016.01) |
| *F21Y 107/70* | (2016.01) |
| *H10H 20/80* | (2025.01) |
| *H10H 20/851* | (2025.01) |
| *H10H 20/852* | (2025.01) |
| *H10H 20/854* | (2025.01) |

(52) U.S. Cl.
CPC ................ *F21K 9/232* (2016.08); *F21K 9/61* (2016.08); *F21K 9/64* (2016.08); *F21K 9/66* (2016.08); *F21K 9/69* (2016.08); *F21S 4/22* (2016.01); *F21S 4/24* (2016.01); *F21V 7/0008* (2013.01); *F21Y 2103/10* (2016.08); *F21Y 2107/70* (2016.08); *H10H 20/8511* (2025.01); *H10H 20/8513* (2025.01); *H10H 20/852* (2025.01); *H10H 20/854* (2025.01); *H10H 20/882* (2025.01)

(58) Field of Classification Search
CPC ..... F21K 9/64; F21K 9/66; F21K 9/69; F21K 9/232; H01L 2224/48137; H01L 25/0753; H10H 20/8511; H10H 20/854; H10H 20/852; H10H 20/882; H10H 20/8512; H10H 20/8513
See application file for complete search history.

(56) References Cited

U.S. PATENT DOCUMENTS

| | | | |
|---|---|---|---|
| 2014/0159562 A1 | 6/2014 | Streppel et al. | |
| 2017/0241598 A1 | 8/2017 | Jiang et al. | |
| 2019/0072260 A1 | 3/2019 | Nichols et al. | |
| 2020/0025343 A1 | 1/2020 | Labas | |
| 2020/0132263 A1* | 4/2020 | Ansems | F21K 9/90 |
| 2021/0048157 A1* | 2/2021 | Macallen | F21V 1/18 |
| 2022/0196214 A1* | 6/2022 | Van Bommel | F21K 9/232 |
| 2023/0099125 A1* | 3/2023 | Van Bommel | H01L 25/0753 |

FOREIGN PATENT DOCUMENTS

| | | | | |
|---|---|---|---|---|
| CN | 105757507 A | 7/2016 | | |
| CN | 206352760 U | 7/2017 | | |
| CN | 207230250 U | 4/2018 | | |
| EP | 2454520 B1 * | 1/2015 | | F21S 4/28 |
| EP | 3526518 B1 | 2/2020 | | |
| JP | 2017191875 A * | 10/2017 | | |
| KR | 20070044101 A | 4/2007 | | |
| KR | 2019-0072572 A | 6/2019 | | |
| WO | 2014/063447 A1 | 5/2014 | | |
| WO | WO-2018087072 A1 * | 5/2018 | | H10W 90/00 |
| WO | 2020-012117 A1 | 1/2020 | | |
| WO | 2020008819 A1 | 1/2020 | | |

OTHER PUBLICATIONS

Machine translation of EP 2454520 B1 retrieved from the FIT database of PE2E search. (Year: 2023).*

Machine translation of JP 2017191875 A retrieved from the FIT database of PE2E search. (Year: 2025).*

Extended European Search Report dated Dec. 21, 2020 for European Patent Application No. 20188569.6.

International Preliminary Report on Patentability Chapter I issued Dec. 6, 2022 for PCT International Application No. PCT/US2021/035793.

International Search Report and Written Opinion mailed Sep. 23, 2021 for PCT International Application No. PCT/US2021/035793.

Partial Supplementary European Search Report dated Aug. 6, 2024 for European Patent Application No. 21817387.0.

* cited by examiner

FLEXIBLE LIGHTING DEVICE AND SUPPORT STRUCTURE

CROSS REFERENCE TO RELATED APPLICATIONS

This application is a § 371 application of International Application No. PCT/US2021/035793, filed Jun. 3, 2021, which claims the benefit of U.S. Provisional Patent Application No. 63/034,195, which was filed on Jun. 3, 2020, and European Patent Appln. No. 20188569.6, which was filed on Jul. 30, 2020, the contents of which are hereby incorporated by reference herein.

BACKGROUND

Light emitting elements such as light emitting diodes (LED) are typically arranged on a substrate, such as on a printed circuit board, for supporting and electrically connecting the light emitting elements. Such substrates are typically rigid and may, thus, restrict the shape of a lighting device and hamper a provision of flexible lighting devices.

SUMMARY

A flexible lighting device includes a flexible transparent body that extends along a length direction of the lighting device, the flexible transparent body comprising particles dispersed therein. The flexible light device also includes a flexible substrate, embedded in the flexible transparent body, and extending along a length direction of the lighting device. The flexible substrate separates the flexible transparent body into a first portion that has a first concentration of the particles and a second portion that has a second concentration of the particles. The first concentration may be different than the second concentration, and the first surface of the flexible substrate may face the first portion and a second surface of the flexible substrate may face the second portion. At least two light emitting elements may be arranged on the first surface of the flexible substrate along the length direction of the lighting device.

BRIEF DESCRIPTION OF THE DRAWINGS

A more detailed understanding can be had from the following description, given by way of example in conjunction with the accompanying drawings wherein.

DETAILED DESCRIPTION

Figure 1A:
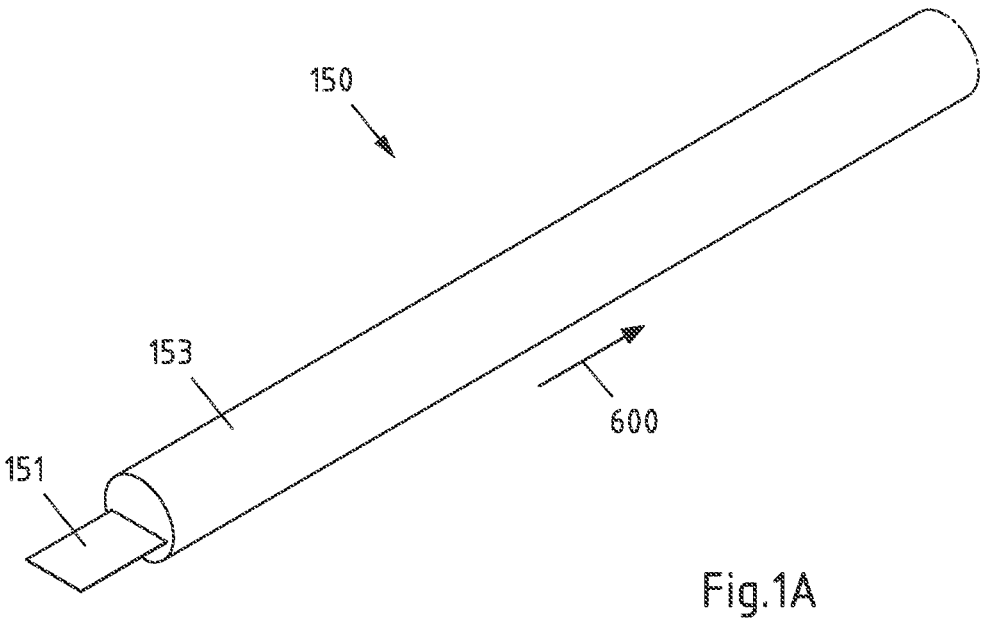
FIG. 1A is a perspective view of a lighting device according to an example embodiment.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Flexibility of lighting devices may be desirable for adjusting shapes of lighting devices to geometries of environments where lighting device are to be installed. For example, in automotive applications it may be desirable to provide flexible lighting devices that follow surfaces or outlines of a car body or of elements within a car interior. Similarly, flexible lightning devices may be of advantage if used for interior decoration.

For example, for automotive lighting applications, flexibility may add an additional degree of freedom for suitably designing appearances of lighting devices. In this way, for example, lighting devices for automotive lighting applications including turn lights, position lights, stop lights or daytime running lights may be improved.

While flexible LED strips may already exist, such LED strips are often limited in terms of light output directionality, while current constructions are often complex and lack in terms of robustness over lifetime, in particular when resulting lighting systems are to be shaped and bent into necessary or desirable directions. Embodiments described herein provide for a flexible lighting device, a corresponding support structure and a lighting system that are improved in terms of light output directionality and complexity.

FIG. 1A is a perspective view of a lighting device 150 according to an example embodiment. In the example illustrated in FIG. 1A, the lighting device 150 includes a flexible substrate 151 embedded in a flexible transparent body 153. Both the flexible substrate 151 and the flexible transparent body 153 may extend along a length direction 600 of the lighting device 150. In embodiments, for example, the flexible substrate 151 may be formed from a polyamide material. Such a flexible substrate may be referred to as a flexfoil. The flexible transparent body 153 may be formed from a flexible transparent silicone material. As both the flexible substrate 151 and the transparent body 153 are made of flexible material, the lighting device 150 may advantageously be bendable essentially in all or in all directions.

Figure 1B:
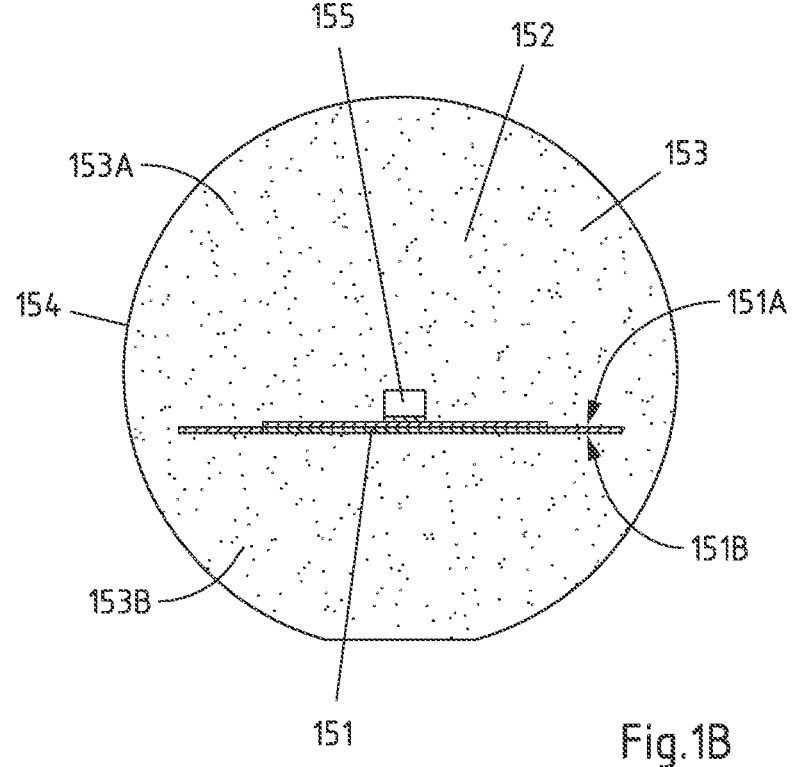
FIG. 1B is a cross-sectional view of the light device of FIG. 1A.
Figure 1C:
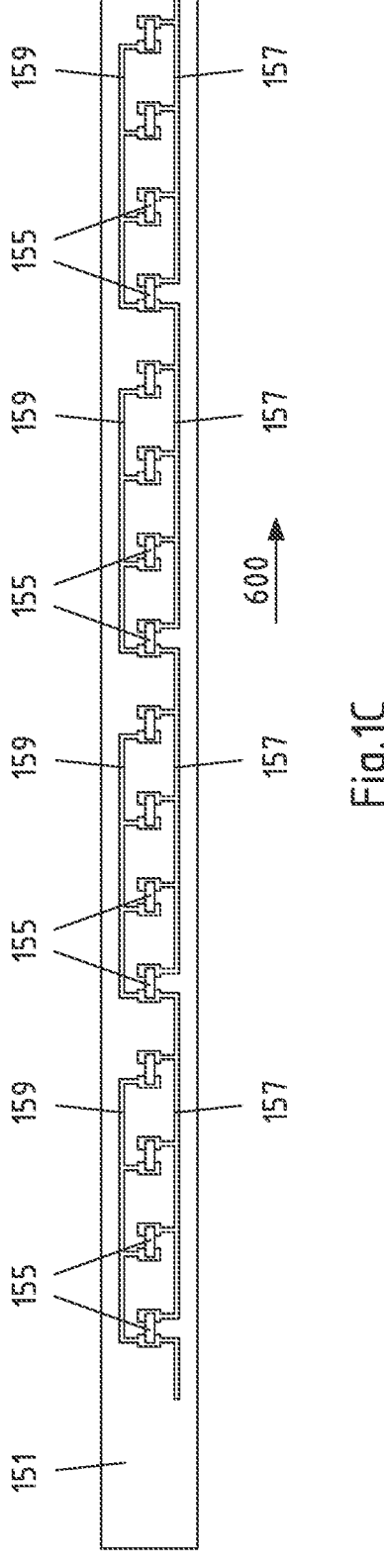
FIG. 1C is a diagram of a number of flip-chip LEDs arranged along a flexible transparent substrate.

FIG. 1B is a cross-sectional view of the light device 150 of FIG. 1A. In the example illustrated in FIG. 1B, light emitting elements 155 are provided on a same side 151A or the first side of the flexible transparent substrate 151. The flexible transparent substrate 151 and the light emitting elements 155 may be fully embedded and fully encapsulated inside of the flexible transparent body 153. In the example illustrated in FIG. 1B, the light emitting elements 155 are flip-chip light emitting diodes (LEDs). Thus, the construction of the lighting device 150 may enable flexibility allowing for bending the lighting device 150 in all directions and, at the same time, the flexible transparent body 153 may mechanically protect and secure both the flexible transparent substrate 151 and the LEDs 155 such that a particularly robust and reliable mechanical construction may be achieved.

In some embodiments, the LEDs may be configured for emitting blue light (also referred to as blue LEDs). Embodiments such as described herein may enable use of particularly small LEDs that may be placed at a particularly high density. Thus, in some embodiments, the LEDs may have a size in between 150 μm×500 μm to 75 μm×200 μm.

In embodiments, at least two light emitting elements may be arranged on one or both of surfaces of the flexible substrate. Arranging light emitting elements on both surfaces may enable a higher light intensity output. However, arranging the at least two light emitting elements only on one surface of the flexible substrate may enable a smaller and less complex construction. Thus, in an exemplary embodiment, the at least two light emitting elements are arranged on a same side of the flexible substrate. In other words, in an exemplary embodiment, light emitting elements of the flexible lighting device are arranged only on a same side of the flexible substrate. Thereby, in an exemplary embodiment, the flexible substrate may be at least semi-transparent. In other words, in an exemplary embodiment, the flexible substrate may be configured to allow a transmission of at least 50% of light emitted from the at least two light emitting elements arranged thereon. Thereby, even though the light emitting elements may be arranged only on one side of the flexible substrate, in particular, in case the at least two light emitting elements are LEDs, such as sapphire based LEDs, part of the light generated by each LED, for example about 20% of the generated light, may be emitted in a backwards direction (for example, in case the LEDs are arranged on the flexible substrate in a direction through the substrate). Thus, the provision of the at least semi-transparent flexible substrate may be advantageous as it may support an omni-directional light emission.

As schematically shown in FIG. 1B, particles 152 may be dispersed within the flexible transparent body 153. In embodiments, these particles may include phosphor particles and/or diffusing particles. In other words, in an exemplary embodiment, the flexible transparent body may correspond to or comprises a silicone matrix with particles embedded therein. As further shown in FIG. 1B, the flexible substrate 151 may separate the first portion 153A of the flexible transparent body 151 and a second portion 153B of the flexible transparent body 153. Thereby, the LEDs 155 may all be arranged on the first side 151A of the flexible substrate 151 facing the first portion 153A of the flexible transparent body 153. In other words, no LEDs may be provided on a second side 151B of the flexible substrate 151 facing the second portion 153B of the flexible transparent body 153.

Use of phosphor particles may be of advantage in combination with light emitting elements configured for blue light, such as blue LEDs. Light emitted from such blue light emitting elements may scatter in part with the phosphor particles and may, thus, in part, be converted into yellow light. The mixing of the so generated yellow light with the remaining non-converted blue light may then lead to a white appearance of light emitted from the lighting device. Thereby, by suitably adjusting the type of phosphor and a concentration of density of used phosphor adjustment of a color temperature, white light may be enabled.

Alternatively, or in addition, use of diffusing particles, in an exemplary embodiment metal oxide particles, such as $TiO_2$ particles, may enable an advantageous diffusing effect and support homogeneity and uniformity of light emitted from the lighting device. Thereby, an inhomogeneity, which may on the one hand be caused by the discrete arrangement of the at least two light emitting elements along the length direction and on the other hand by a bending of the flexible light emitting device be advantageously compensated for.

As mentioned above, while not explicitly shown in FIG. 1B, in an exemplary embodiment, the first portion 153A and the second portion 153B of the flexible transparent body 153 may be respectively provided with first and second concentrations of the dispersed particles 152. In some embodiments, the first and second concentrations may be adjusted in accordance with an asymmetrical light distribution within the flexible transparent body 153 caused by the fact that the LEDs 155 may be provided only on one side of the flexible transparent substrate 151. For example, a concentration of the dispersed particles in the first portion 153A may be made higher in accordance with a higher light intensity being exposed to the direct emission of the LEDs 155. Accordingly, a concentration of particles may be made lower in the second portion 153B, and this portion may be exposed only to the lower indirect emission of the LEDs 155 limited to the transparent flexible substrate 151. Noting that a higher density of particles usually leads to a higher amount of scattering events and, thus, to a larger diffusing and/or color conversion effect, color and/or intensity uniformity can advantageously be achieved in case of an exemplary embodiment in which the first concentration of the dispersed particles is larger than the second concentration of the dispersed particles.

In order to further enhance the omni-directional light emission properties of the lighting device, the particle concentrations may be tuned on each side of the flexible substrate to adjust color and intensity distributions as a function of angle around the flexible substrate. Thus, in an exemplary embodiment, the flexible substrate may separate a first portion of the flexible transparent body and a second portion of the flexible transparent body. Thereby, the at least two light emitting elements may be arranged on a first side of the flexible substrate facing the first portion of the flexible body. Further, the first portion of the flexible transparent body may comprise a first concentration of the dispersed particles and the second portion of the flexible transparent body may comprise a second concentration of the dispersed particles. Alternatively, or in addition, the first portion of the flexible transparent body may be provided with a first coating of first thickness and/or density, and the second portion of the flexible transparent body may be provided with a second coating of second thickness and/or density.

Thus, by tuning a concentration of particles, a color and/or an intensity distribution can be suitably adjusted such that color and/or intensity of light emitted from the lighting device is uniform as a function of angle. In other words, spottiness in color and/or intensity can advantageously be reduced and/or prevented.

Alternatively, or in addition, in an exemplary embodiment, the first thickness and/or density may be larger than the second thickness and/or density. In other words, in an alternative or additional approach, a thickness and/or density of a coating provided on a side facing direct emission of the LEDs may be adjusted to be larger than a thickness and/or density of a coating provided on the side of the flexible transparent body facing indirect emission of the LEDs (through the semi-transparent flexible substrate). Again, this approach may also enable achieving light emission that is uniform in terms of intensity and/or color thereby preventing spottiness that otherwise may be caused in particular by the discrete arrangement of light emitting elements along the flexible substrate.

As can be taken from FIG. 1B, an outer surface 154 of the flexible transparent body 153 may be an interface of the flexible transparent body 153 with the environment (e.g., air), such that a corresponding refractive index may abruptly change from inside of the flexible transparent body 153 towards the outside. As a result, light emitted from light emitting elements 155 impinging on the interface 154 may at least partially be reflected back and the essentially circular interface 154 thus may provide a mix box for light emitted from LEDs 155. Thus, light emitted from the light emitting elements 155 may at least in part be reflected one or more times inside of the flexible transparent body 153 before being emitted from the flexible transparent body 153, which may further contribute to a homogeneous and uniform light emission (in terms of color and intensity), which may advantageously prevent spottiness that may otherwise be caused by a discrete arrangement of LEDs 155 along the flexible transparent substrate.

FIG. 10 is a diagram of a number of flip-chip LEDs 155 arranged along the flexible transparent substrate 151. As illustrated in the example of FIG. 10, the flip-chip LEDs 155 are electrically coupled to one another by corresponding conductor tracks 157, 159.

In some embodiments, at least four, five or six light emitting elements may be arranged along a length direction on the flexible substrate per one centimeter (cm). For example, in an exemplary embodiment, a distance between neighboring light emitting elements may be around 1 mm. In this way, for example, up to 10 light emitting elements may be arranged per cm. Such high density arrangement may be of advantage as a highly homogeneous intensity/color distribution can be achieved even without using a special spatially adapted diffusor.

In embodiments, the at least two light emitting elements may be arranged in a single row along the length direction, which may be advantageous in terms of a possible small diameter of a corresponding lighting device. Nevertheless, two or even more rows (e.g., longitudinal arrangements) of light emitting elements may be provided on the flexible substrate along the length direction, which may enable higher reachable light intensities. Further, while LEDs of a same color may be used, such as LEDs configured for emitting blue light, it is possible to use LEDs of different colors. Thus, in some embodiments, the lighting device may comprise at least three light emitting elements, and at least one of the at least three light emitting elements may be configured for emitting red light, at least one of the at least three light emitting elements may be configured for emitting green light, and at least one of the at least three light emitting elements may be configured for emitting blue light. Such embodiment may be advantageous as by providing a suitable electronic control, in principle any color and/or color combination can be achieved along the length of the lighting device. In some embodiments, LEDs of different colors may be provided in form of RGB groups (or RGB-islands). These RGB-islands may be arranged along the length direction with suitable mutual distance. To enable mixing of colors, such RGB-islands may be provided with individual optics, such as individual silicone mixing optics.

Figure 2:
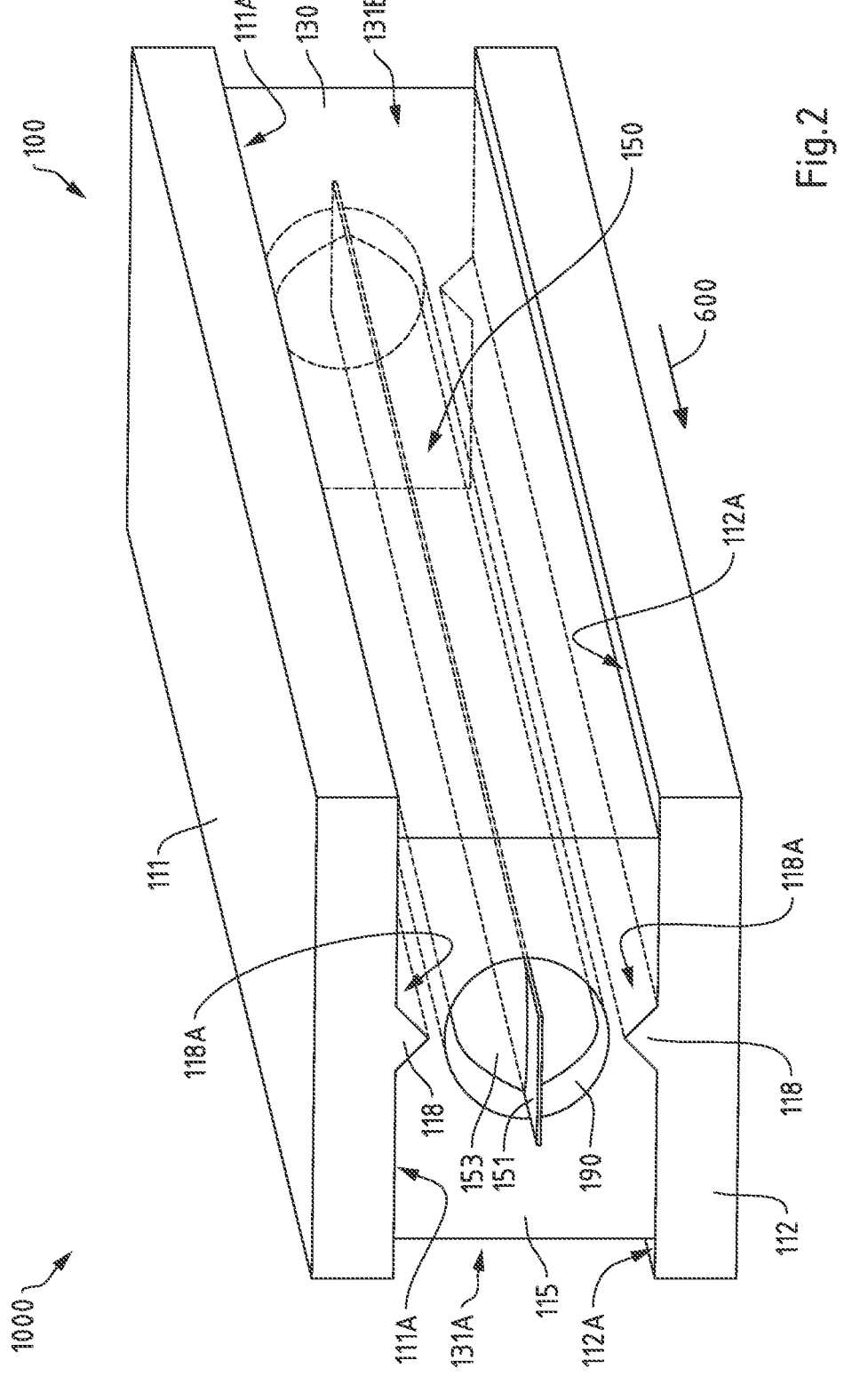
FIG. 2 is a perspective view of an example lighting system including the lighting device of FIG. 1A and a support structure.

FIG. 2 is a perspective view of an example lighting system 100 including the lighting device of FIG. 1A and a support structure 100. In the example illustrated in FIG. 2, the support structure 100 includes an inner support for supporting the flexible lighting device 150 in the form of a support channel 190 in which the flexible lighting device 150 is received. The channel 190 may be formed inside of the flexible transparent material 115 that may be between two opposing support walls 111, 112. In other words, in an exemplary embodiment, an inner volume of the support structure may be filled (in an exemplary embodiment fully) with the flexible transparent material, which may further contribute to robustness and reliability of the support structure and to a corresponding lighting system comprising the support structure and a lighting device. In an exemplary embodiment, the flexible transparent material may correspond to or comprise transparent silicone material.

In other embodiments, however, a support for supporting the flexible lighting device could alternatively be realized, for example, using an inner support tube connected with an outer housing, such as with the two opposing support walls 111,112, using one or more dedicated connection members. However, the construction in the example illustrated in FIG. 2 using the flexible transparent material, which by means of the channel is in direct contact with outer faces of the lighting device 150, may be advantageous in terms of optical coupling and on the other hand in terms of stability of the entire construction.

The support 100 may further include two opposing reflective surfaces 111A, 112A, which, in the illustrated example, may correspond to inner surfaces 111A, 112A of the two opposing support walls 111, 112. Alternatively, for example in an embodiment without the two opposing support walls, the two opposing reflective surfaces could be realized in form of respective reflective coatings provided on opposing sides of the flexible transparent material.

The two opposing reflective surfaces 111A, 112A may enclose a mixing volume 130, which may allow passage of light emitted from the flexible lighting device 150 inserted in channel 190 and for light reflected from one or both of the two opposing reflective surfaces 111A, 112A. In other words, the two opposing reflective surfaces 111A, 112A may form a mix box for light emitted from the inserted flexible lighting device 150 and, thus, may advantageously enable light emitted from each one of the two separated light output faces 131A, 131B of support structure 100 to be uniform in terms of intensity and color temperature.

In other words, light emitted from an inserted lighting device that does not leave the support structure on a direct way through one of the at least two light output faces may be reflected one or more times on one of the at least two opposing reflective surfaces. As a result of this essentially statistic process, light emitted from the at least two opposing reflective surfaces have undergone a mixing process, which may make light output from the support structure highly uniform in terms of color and intensity and, advantageously, may compensate for a spottiness, which otherwise may be caused by the discrete arrangement of the at least two light emitting elements arranged along the length direction.

Being provided with at least two light output faces, the support structure may be of particular advantage as it may enable, for example, a bi-directional or even omni-directional light emitter. Such bi- or omni-directional light emission may thereby be achieved by an uncomplex construction with flexible components that are robust and reliable.

In an exemplary embodiment, the at least two opposing reflective surfaces may be arranged at respective outer faces of the flexible transparent material. For example, the outer faces of the flexible transparent material may be interfaces of the flexible transparent material with the outside, such as with air, and may be provided with a suitable coating. Alternatively, or in addition, the flexible transparent material may be embedded in a suitable outer housing.

Thus, in an exemplary embodiment, the support structure may further comprise at least two opposing support walls, which may be arranged at a mutual angle or which may be, in an exemplary embodiment, arranged essentially mutually parallel (e.g., at an angle of 00±50). Thereby, the two opposing reflective surfaces may correspond to respective inner surfaces of the at least two opposing support walls. The opposing support walls may be part of or form an outer housing structure of the support structure and may be formed from or comprise a suitable flexible non-transparent material. In an exemplary embodiment, the at least two opposing support walls may comprise or be formed from flexible silicone material further comprising diffusing particles, such as metal oxide or $TiO_2$ particles (e.g., from flexible white silicone). Thereby, the two opposing support walls may provide an advantageous mix box functionality with essentially diffuse highly reflective properties.

Thus, the particular construction of lighting system 1000, as shown in FIG. 2, may not only provide a compact flexible light strip for bi-directional emission, but, at the same time, may enable particularly uniform and homogenous light emission from all of the two separated output faces. Furthermore, the embodiment illustrated in FIG. 2, including only one single flexible lighting device, may realize two separate light output faces with a single light source. In order to further support efficiency of light emission and, for example, to prevent light loss at inner portions of the lighting system, lighting system 1000 of FIG. 2 may further include two optical separation members 118, each of which may extend from a respective one of the two opposing support walls 111,112 such that support channel 190 may be arranged in between the two optical separation members 118. In the example illustrated in FIG. 2, each of the at least two optical separation members may have an essentially triangular cross-section with one side face being arranged on respective inner surfaces 111A, 112A of the two opposing support walls and an opposing corner of the triangular cross section being arranged facing towards the support channel 190. In this way, each of the two optical separation member 118 may include two respective further reflective surfaces 118A that may be arranged for reflecting light emitted from the flexible lighting device 150 toward a respective one of the two separated light output faces 131A, 131B of the support structure 100.

Thereby, the optical separation members may correspond to a part of the support structure comprising reflective surfaces in addition to at least two opposing reflective surfaces for separating the light mixing volume into separate portions respectively assigned to the at least two light output faces. Thereby, the optical separation members may advantageously contribute to the bi- or omni-directionality of light output from a lighting system comprising the support structure and a corresponding lighting device and, for example, may help to prevent intensity losses inside of the support structure.

Alternatively, in an exemplary embodiment, the support structure may comprise at least two inner supports, each for supporting a respective one of at least two corresponding flexible lighting devices. Thereby, the at least one optical separation member may correspond to a separation wall extending from one of the at least two opposing support walls to the other one of the at least two opposing support walls. Thereby, the separation wall may comprise at least one reflective surface arranged for reflecting at least part of light emitted from an inserted at least one flexible lighting device towards at least one of at least two separated light output faces of the support structure. This embodiment may be in particular suitable in a case where a respective lighting device is to be used per light output face of the support structure, such as in cases where high light intensities are desirable.

Figure 3:
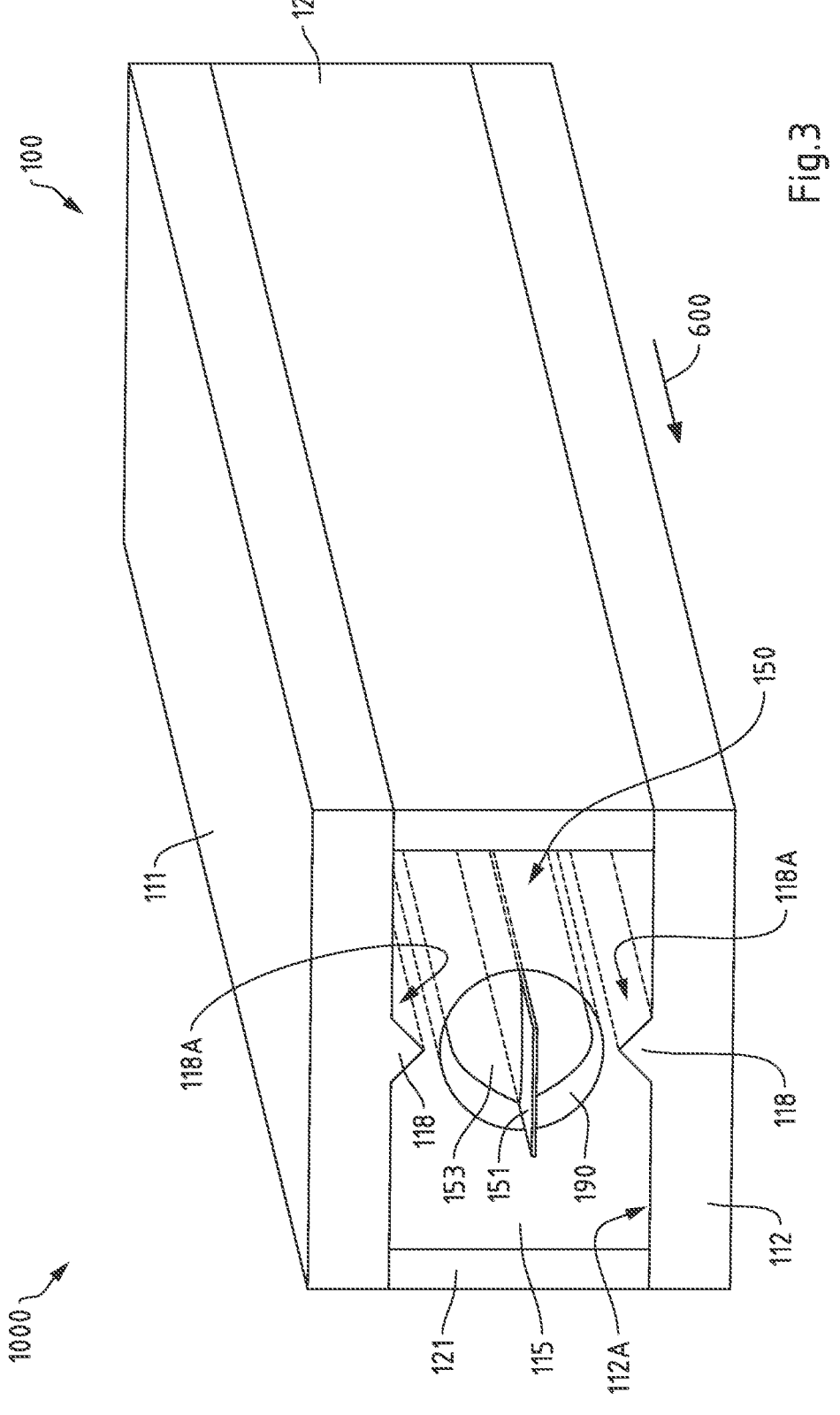
FIG. 3 is a diagram of another example embodiment of a lighting system.

FIG. 3 is a diagram of another example embodiment of a lighting system whereby corresponding components from FIG. 2 are labeled with corresponding reference numerals in FIG. 3. In addition to the components shown in FIG. 2, lighting system 1000 of FIG. 3 may further include a pair of diffusor plates 123 that may be arranged on opposing faces of flexible transparent material 115, whereby the two opposing faces of the flexible transparent material 115 may respectively correspond to the corresponding separated output faces 131A, 131B of the support structure 100.

Thereby, in an example embodiment, an optical density of diffusor plates 121,123 may be provided in accordance with the discrete distribution of LEDs 155 along the length direction 600 of lighting device 150. For example, a density of the diffusor plates 121, 123 may be made lower at portions of the diffusor plates that are arranged corresponding to portions of the flexible substrate in between LEDs 155. The lower density providing less scattering in between the LEDs 155 and a higher density directly over the LEDs may advantageously help to achieve a homogeneous color/intensity along the length of the lighting device.

In an exemplary embodiment, each of the diffusor plates 121, 123 may be made from silicone comprising $TiO_2$ particles. Such optical diffusor plates may be advantageous as they may enable highly flexible diffusor elements that have strong scattering properties. While such diffusor plates may be advantageous under certain circumstances, for certain applications, sufficient uniformity of the emitted light may already be achieved by mixing volume 130 and the mixing properties of lighting device 150.

As further shown in FIGS. 2 and 3, a lighting device 150 may be arranged inside of the support structure 100 such that the flexible substrate 150 forms an angle of essentially 0° with each of the at least opposing reflective surfaces 111A, 112A. In other words, the flexible substrate 150 may be arranged essentially parallel with the opposing reflective surfaces 111A, 112A. In this way, the arrangement of the lighting device 150 may advantageously provide a symmetric distribution of light within mixing volume 130 and, thus, may enable intensities of light emitted from the two light output faces to be essentially the same.

Figure 4:
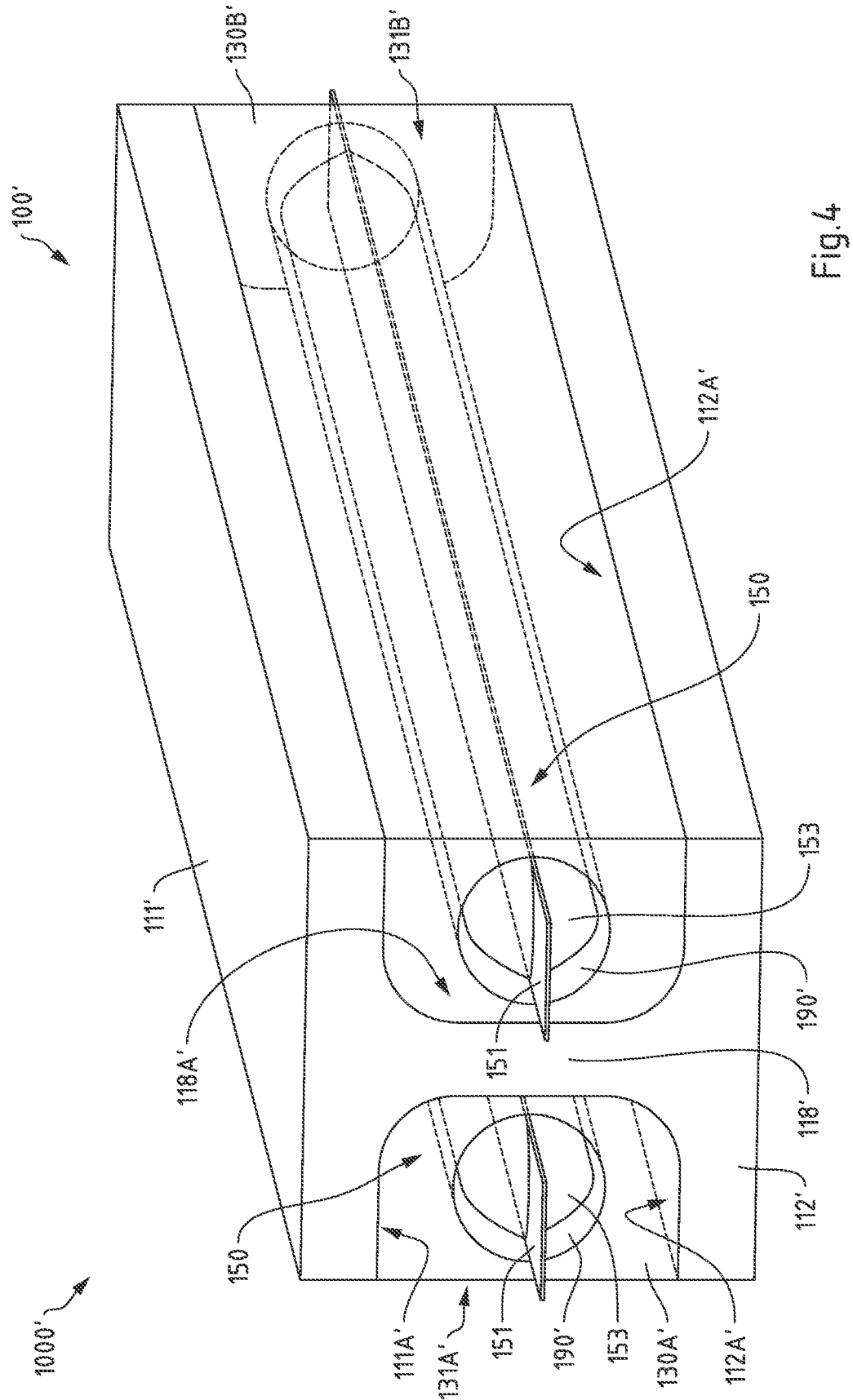
FIG. 4 is a perspective view of another example lighting system.

FIG. 4 is a perspective view of another example lighting system 1000'. In the example illustrated in FIG. 4, the lighting system 1000' includes two lighting devices 150. Each lighting device 150 may be arranged in a respective mixing volume 130A', 130B', and the two mixing volumes 130A', 130B' may be separated by an optical separation member that corresponds to a separation wall 118'. As shown in the example in FIG. 4, the optical separation wall 118' may extend from one of the two opposing support walls 111 to the other wall of the two opposing support walls 11, and, thus, in the illustrated embodiment the optical separation wall 118' comprises a reflective surface 118A' on each side facing each one of the mixing volumes 130A', 1306'. Each of the two reflective surfaces 118' may thus be arranged for reflecting at least part of light emitted from the respective flexible lighting devices 150 towards the respective one of the two separated light output faces 131A', 131B' of support structure 100'.

In some embodiments, the lighting system 1000' may be or include an automotive headlight, an automotive rear combination light, a car body light and/or an automotive interior light. Thereby, a rear lamp and/or a headlight may address several applications, such as daytime running light, front-position light, or stop light.

In an exemplary embodiment of the lighting system 1000', the lighting device may be arranged inside of the support structure such that the flexible substrate forms angle of 0°±45°, 0°±30°, 0°±15°, or 0°±5° with at least one of the at least two opposing reflective surfaces. In other words, in an exemplary embodiment, the lighting device may be arranged inside of the support structure such that the flexible is essentially parallel to one or more of the at least two opposing reflective surfaces. Such an arrangement may be of particular advantage as by thus arranging the light emitting elements facing in a direction which in an exemplary embodiment is perpendicular to main light output directions of the at least two light output faces, light output intensities at the respective light output faces may essentially be equalized. In addition, a mixing effect of the light mixing volume can advantageously be exploited, and a beneficial uniformity of the output light can be achieved.

In an exemplary embodiment, the support structure may further comprise at least two diffusing elements or diffusor plate, respectively arranged in correspondence with the separated light output faces of the support structure, such as on opposing faces of the flexible transparent material. In an exemplary embodiment, an optical density of each of the optical diffusing elements may vary along the length direction in accordance with a discrete distribution of the at least two light emitting elements. Thus, the optical diffusing element may additionally help to provide advantageous uniformity of light emitted from the lighting system in terms of intensity and color temperature, thereby preventing spottiness that otherwise may be caused by a discrete arrangement of light emitting elements alone.

As a result, lighting systems 1000, 1000' may correspond to advantageous optical elements providing not only flexible elongated light sources enabling bi- or even omni-directional light emission but may also be highly advantageous in terms of uniformity and homogeneity of emitted light intensity and color temperature. Spottiness that, on the one hand, may be caused by a discrete arrangement of LEDs along a length direction of the respective lighting systems, and, on the other hand, by bending of the lighting systems, may be advantageously prevented by the measures described herein.

Use of compact, small, flip-chip-LEDs may allow, on the one hand, thin and compact constructions and, on the other hand, flexible and solid constructions that may advantageously be used in, for example, automotive applications, such as for automotive headlights, automotive tail lights and/or for automotive interior lights. In addition, lighting systems may also be applied in architectural applications, such as for interior lighting applications.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. An LED lighting strip comprising:
   a support structure comprising:
   a first support wall having a flat first inner reflective surface and a first outer surface opposite the first flat inner reflective surface,
   a second support wall opposite the first support wall and having a flat second inner reflective surface and a second outer surface opposite the flat first inner reflective surface, the flat first inner reflective surface facing, and parallel to, the flat second inner reflective surface,
   at least one mixing volume comprising a flexible transparent material enclosed by, and in contact with, both the flat first inner reflective surface and the flat second inner reflective surface, and
   a channel formed in the flexible transparent material; and
   a lighting device having a tube-shaped outer surface and two end surfaces, the lighting device disposed in the channel such that the mixing volume fully surrounds the tube-shaped outer surface of the lighting device, the lighting device comprising:
   a flexible transparent body that extends along a length direction of the lighting device, the flexible transparent body comprising particles dispersed in a transparent material, wherein the particles comprise both phosphor particles and light-scattering particles,
   a flexible substrate, embedded in the flexible transparent body, and extending along a length direction of the lighting device, wherein: the flexible substrate separates the flexible transparent body into a first portion that has a first concentration of the particles and a second portion that has a second concentration of the particles, the first concentration of the particles, including both the phosphor particles and light-scattering particles, is higher than the second concentration of the particles, including both the phosphor particles and the light-scattering particles, a first surface of the flexible substrate faces the first portion, a second surface of the flexible substrate faces the second portion, and the flexible substrate is at least semi-transparent,
   at least two light emitting elements arranged on the first surface of the flexible substrate along the length direction of the lighting device and configured to emit a main portion of its light emission toward the first portion of the flexible transparent body a second portion of its light emission through the flexible substrate such that a color and an intensity of light emitted through an outer surface of the flexible transparent body is uniform, and an optical separation member extending from the flat first inner reflective surface and the flat second inner reflective surface and towards the channel, wherein each of the optical separation members has a triangular-shaped cross section.

2. The lighting system according to claim 1, wherein the lighting device is arranged inside of the support structure such that the flexible substrate forms an angle of 0°±45° with at least one of the at least two opposing reflective surfaces.

* * * * *